US009748352B2

(12) United States Patent
Liu et al.

(10) Patent No.: US 9,748,352 B2
(45) Date of Patent: Aug. 29, 2017

(54) MULTI-CHANNEL GATE-ALL-AROUND FET

(71) Applicants: STMicroelectronics, Inc., Coppell, TX (US); GlobalFoundries Inc., Grand Cayman (KY); International Business Machines Corporation, Armonk, NY (US)

(72) Inventors: Qing Liu, Irvine, CA (US); Ruilong Xie, Schenectady, NY (US); Chun-chen Yeh, Clifton Park, NY (US); Xiuyu Cai, Niskayuna, NY (US)

(73) Assignees: STMicroelectronics, Inc, Coppell, TX (US); GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/984,688

(22) Filed: Dec. 30, 2015

(65) Prior Publication Data

US 2016/0111513 A1    Apr. 21, 2016

Related U.S. Application Data

(62) Division of application No. 14/312,418, filed on Jun. 23, 2014, now Pat. No. 9,502,518.

(51) Int. Cl.
*H01L 21/336* (2006.01)
*H01L 29/423* (2006.01)
(Continued)

(52) U.S. Cl.
CPC ........ *H01L 29/42392* (2013.01); *B82Y 10/00* (2013.01); *H01L 29/0649* (2013.01);
(Continued)

(58) Field of Classification Search
CPC ..................................................... H01L 21/845
(Continued)

(56) References Cited

U.S. PATENT DOCUMENTS

| | | | |
|---|---|---|---|
| 7,427,794 B2 | 9/2008 | Chau et al. | |
| 7,456,476 B2 | 11/2008 | Hareland et al. | |
| 7,973,389 B2 | 7/2011 | Rios et al. | |
| 8,120,073 B2 | 2/2012 | Rakshit et al. | |
| 8,541,274 B1 | 9/2013 | Xie et al. | |
| 8,679,902 B1 | 3/2014 | Basker et al. | |
| 8,728,885 B1 | 5/2014 | Pham et al. | |
| 8,753,942 B2 * | 6/2014 | Kuhn | H01L 21/76224 438/157 |
| 8,778,768 B1 | 7/2014 | Chang et al. | |
| 9,257,527 B2 * | 2/2016 | Hashemi | H01L 21/02507 |
| 2006/0049429 A1 | 3/2006 | Kim et al. | |

(Continued)

OTHER PUBLICATIONS

"How Intel's 3D tech redefines the transistor (FAQ)," http://www.cnet.com/news/how-intels-3d-tech-redefines-the-transistor-faq/, May 4, 2011, 4 pages.
(Continued)

*Primary Examiner* — Chandra Chaudhari
(74) *Attorney, Agent, or Firm* — Seed IP Law Group LLP

(57) ABSTRACT

A high performance GAA FET is described in which vertically stacked silicon nanowires carry substantially the same drive current as the fin in a conventional FinFET transistor, but at a lower operating voltage, and with greater reliability. One problem that occurs in existing nanowire GAA FETs is that, when a metal is used to form the wraparound gate, a short circuit can develop between the source and drain regions and the metal gate portion that underlies the channel. The vertically stacked nanowire device described herein, however, avoids such short circuits by forming insulating barriers in contact with the source and drain regions, prior to forming the gate. Through the use of sacrificial films, the fabrication process is almost fully self-aligned, such that only one lithography mask layer is needed, which significantly reduces manufacturing costs.

20 Claims, 10 Drawing Sheets

(51) Int. Cl.

| | |
|---|---|
| *H01L 29/78* | (2006.01) |
| *H01L 29/16* | (2006.01) |
| *H01L 29/06* | (2006.01) |
| *H01L 29/51* | (2006.01) |
| *H01L 29/66* | (2006.01) |
| *H01L 29/167* | (2006.01) |
| *H01L 29/36* | (2006.01) |
| *H01L 29/10* | (2006.01) |
| *H01L 29/161* | (2006.01) |
| *H01L 29/165* | (2006.01) |
| *B82Y 10/00* | (2011.01) |
| *H01L 29/775* | (2006.01) |
| *H01L 29/786* | (2006.01) |

(52) U.S. Cl.
CPC ...... *H01L 29/0673* (2013.01); *H01L 29/1037* (2013.01); *H01L 29/161* (2013.01); *H01L 29/165* (2013.01); *H01L 29/167* (2013.01); *H01L 29/1608* (2013.01); *H01L 29/36* (2013.01); *H01L 29/42364* (2013.01); *H01L 29/51* (2013.01); *H01L 29/518* (2013.01); *H01L 29/6681* (2013.01); *H01L 29/66439* (2013.01); *H01L 29/66545* (2013.01); *H01L 29/66742* (2013.01); *H01L 29/775* (2013.01); *H01L 29/785* (2013.01); *H01L 29/78618* (2013.01); *H01L 29/78696* (2013.01)

(58) Field of Classification Search
USPC .............................. 438/284, 876, 962, 976
See application file for complete search history.

(56) References Cited

U.S. PATENT DOCUMENTS

| | | |
|---|---|---|
| 2006/0216897 A1 | 9/2006 | Lee et al. |
| 2007/0029586 A1 | 2/2007 | Orlowski |
| 2008/0014689 A1 | 1/2008 | Cleavelin et al. |
| 2008/0017934 A1 | 1/2008 | Kim et al. |
| 2008/0135949 A1 | 6/2008 | Lo et al. |
| 2009/0090976 A1 | 4/2009 | Kavalieros et al. |
| 2010/0207208 A1 | 8/2010 | Bedell et al. |
| 2011/0057163 A1 | 3/2011 | Liu et al. |
| 2011/0108804 A1 | 5/2011 | Bangsaruntip et al. |
| 2011/0133162 A1 | 6/2011 | Bangsaruntip et al. |
| 2011/0309333 A1 | 12/2011 | Cheng et al. |
| 2012/0007051 A1 | 1/2012 | Bangsaruntip et al. |
| 2013/0270512 A1 | 10/2013 | Radosavljevic et al. |
| 2013/0302955 A1 | 11/2013 | Vinet et al. |
| 2013/0341596 A1 | 12/2013 | Chang et al. |
| 2014/0264276 A1 | 9/2014 | Chang et al. |

OTHER PUBLICATIONS

Singh et al., "Ultra-Narrow Silicon Nanowire Gate-All-Around CMOS Devices: Impact of Diameter, Channel-Orientation and Low Temperature on Device Performance," Electron Devices Meeting, IEDM '06 International, Dec. 11-13, 2006, 4 pages.

\* cited by examiner

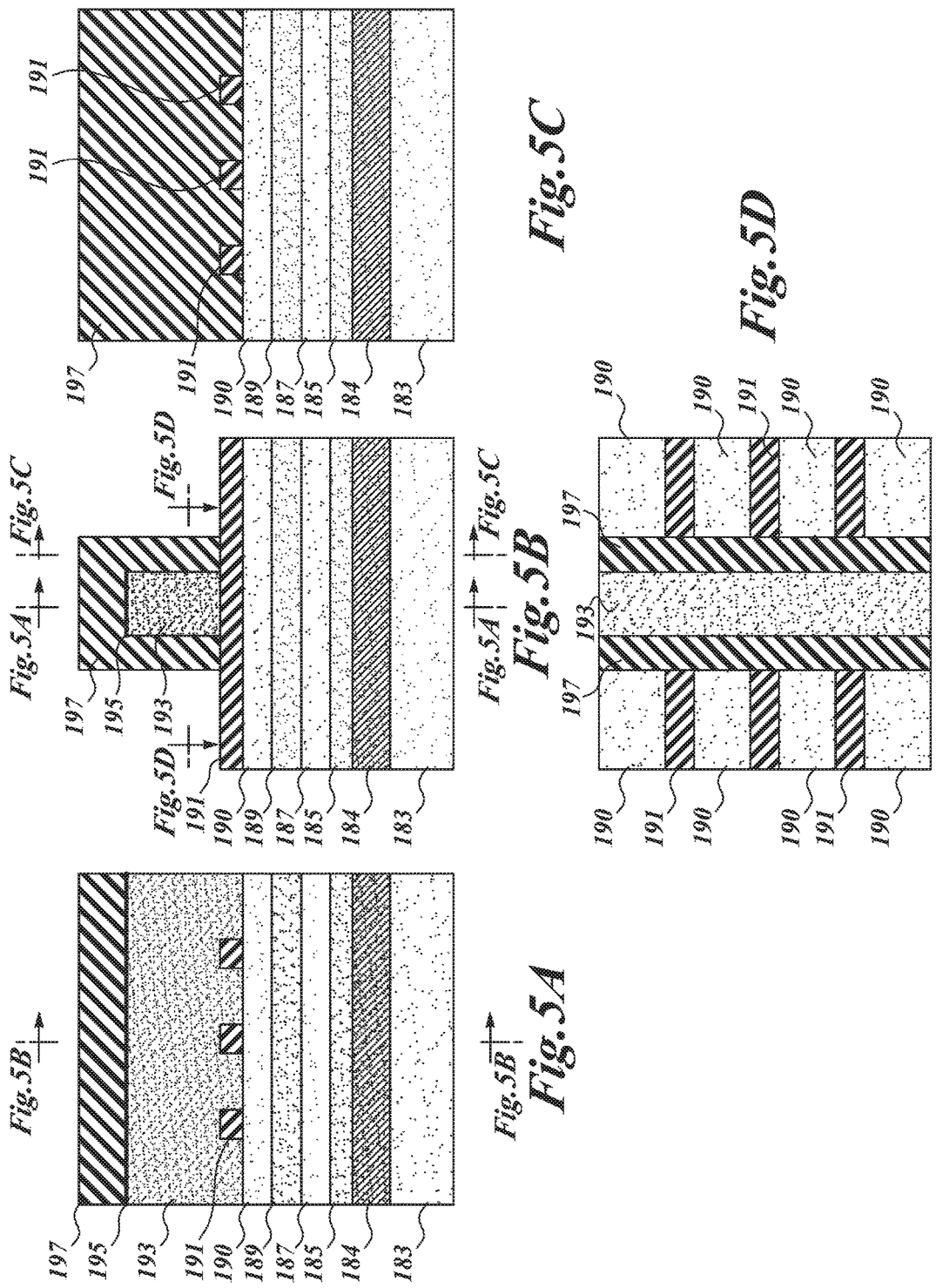

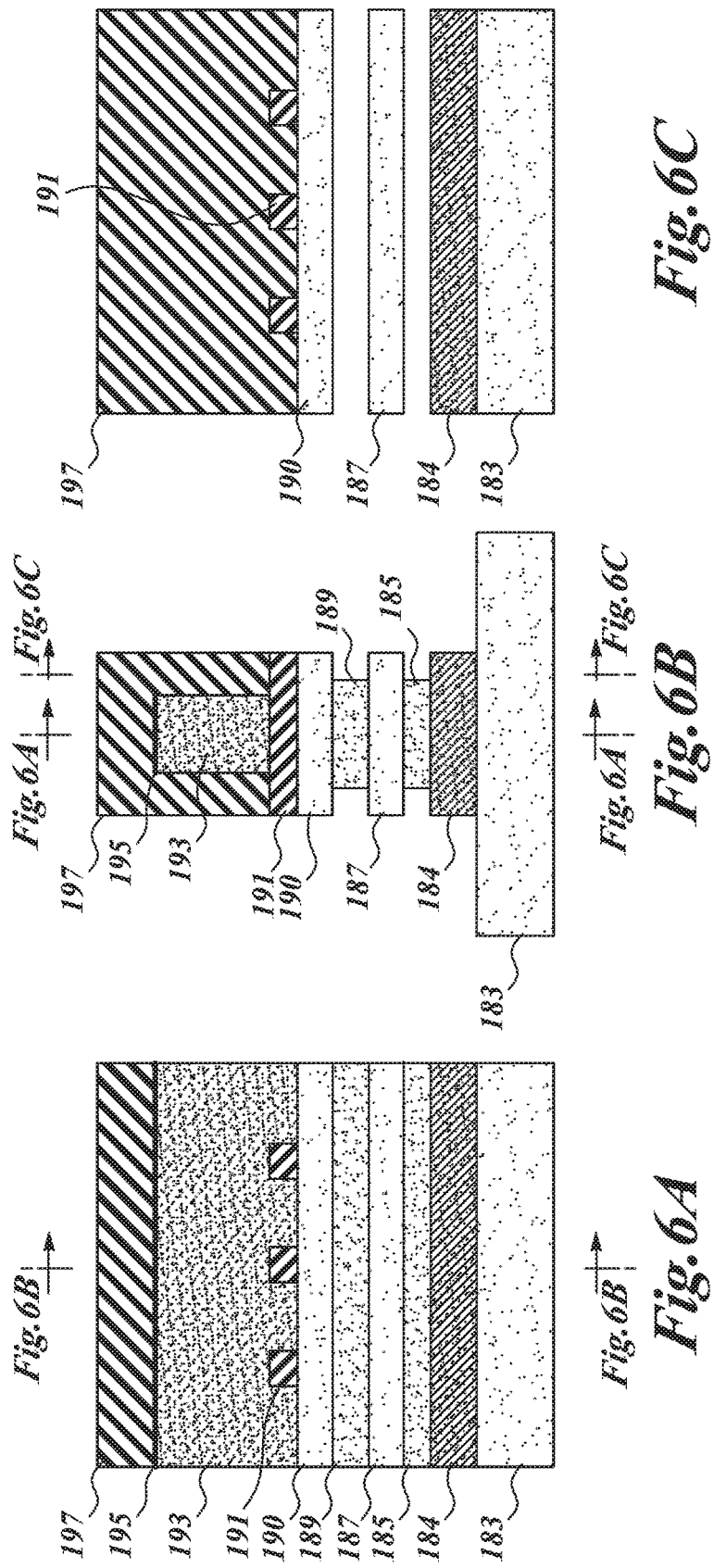

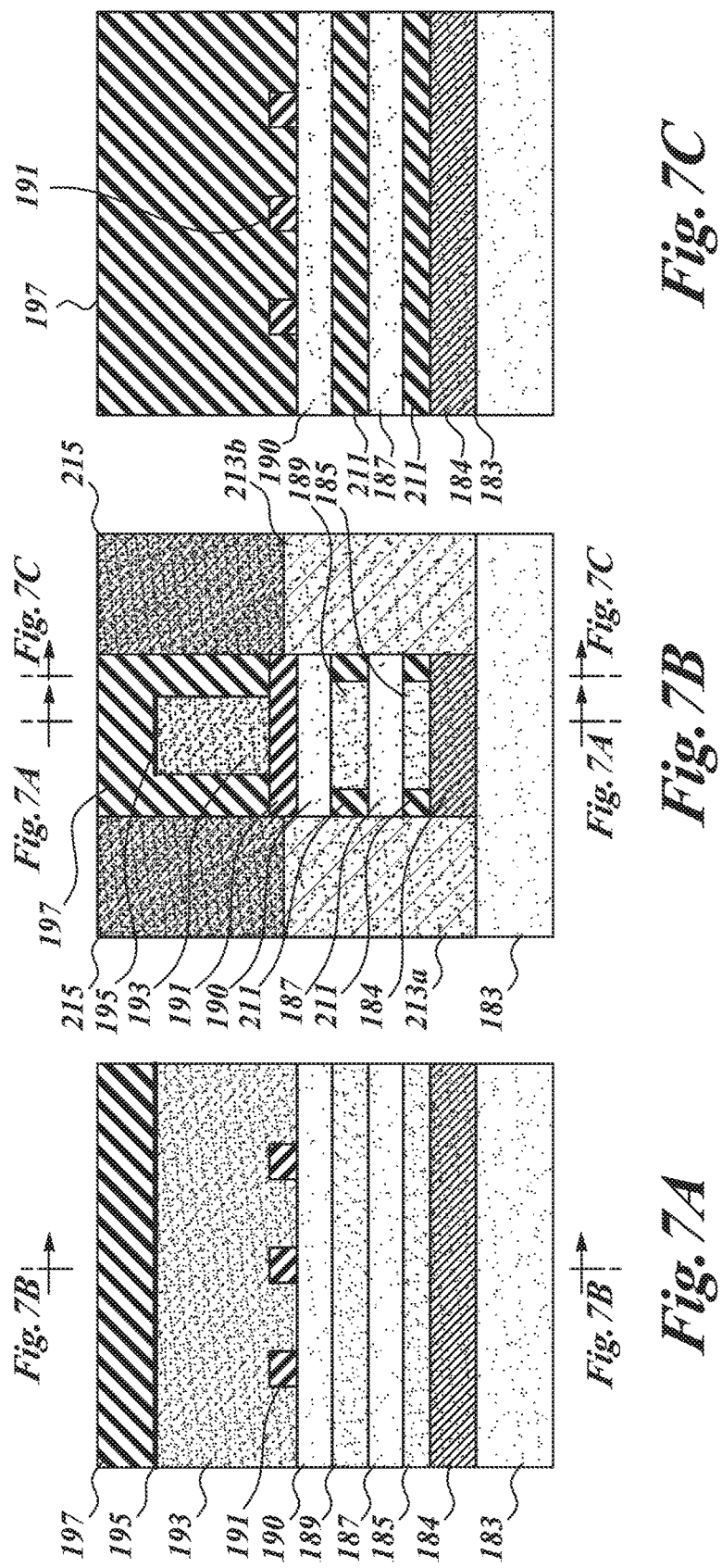

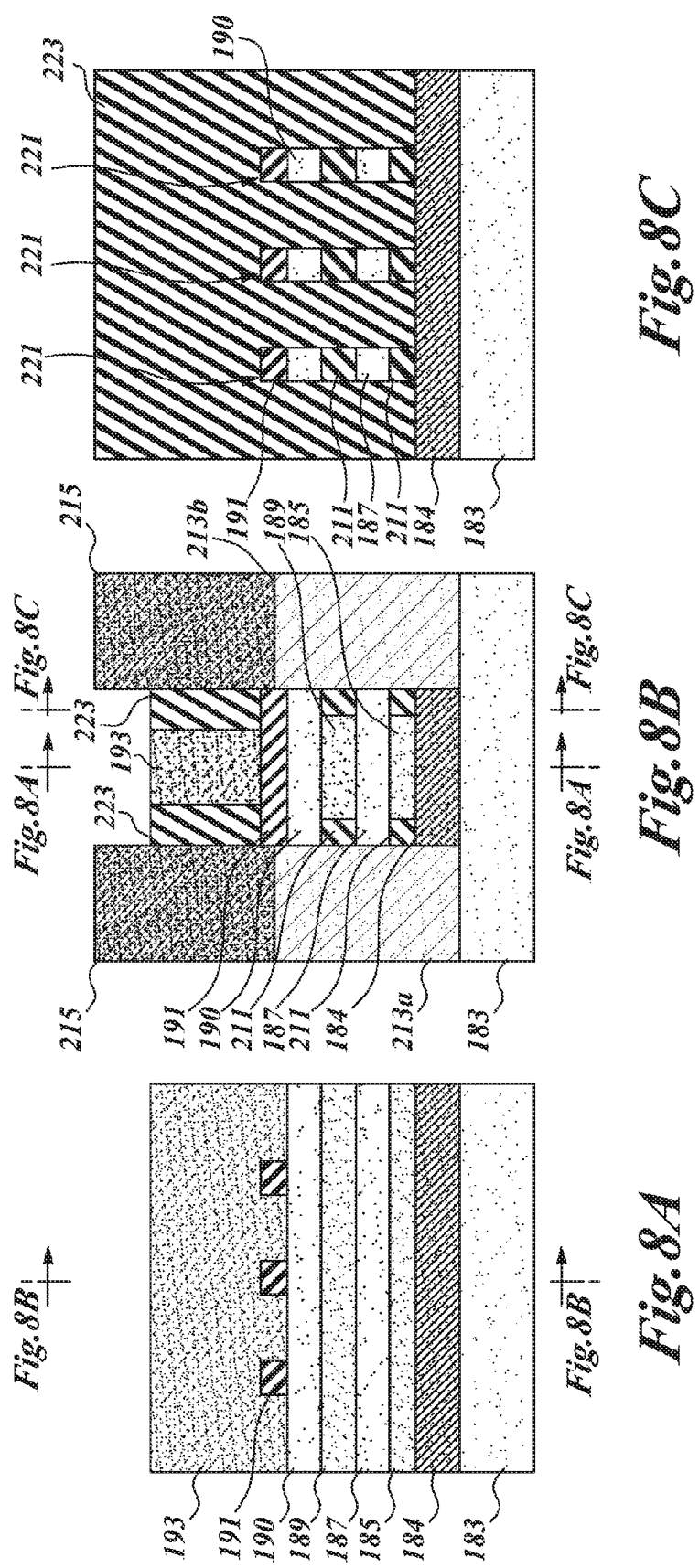

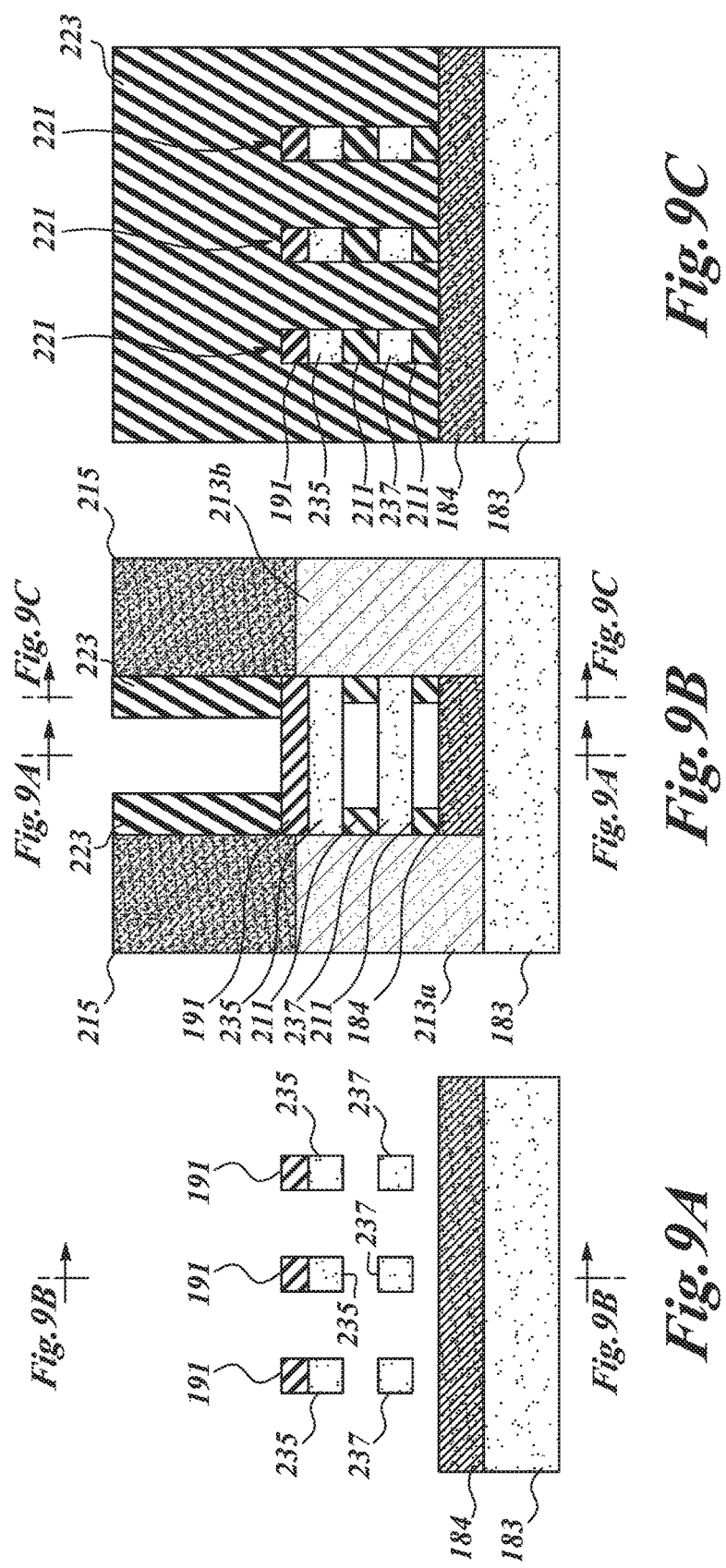

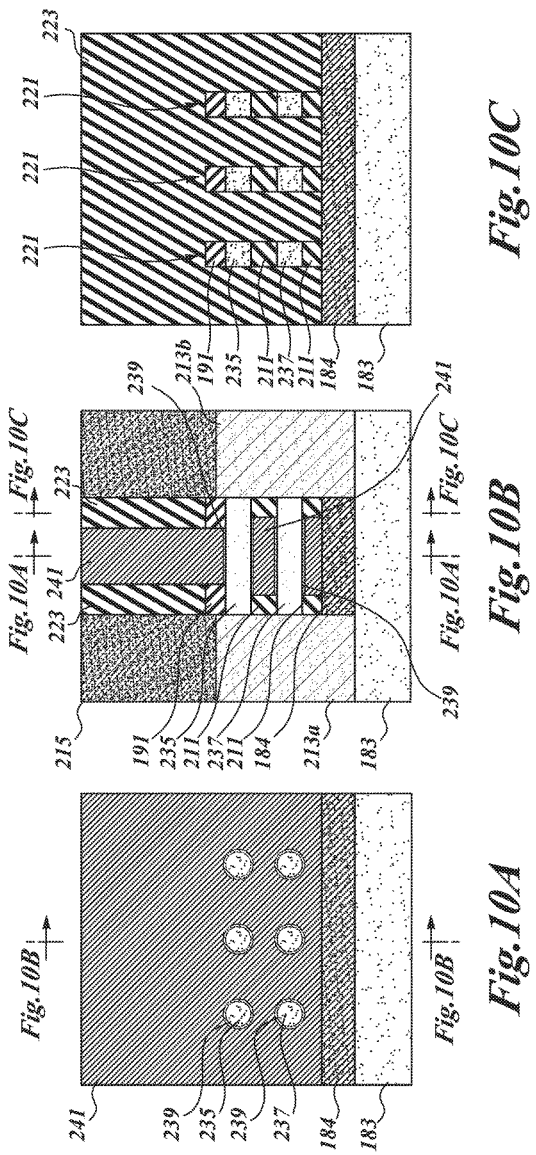

MULTI-CHANNEL GATE-ALL-AROUND FET

CROSS REFERENCE TO RELATED APPLICATION

This patent application is a divisional of U.S. patent application Ser. No. 14/312,418 filed Jun. 23, 2014, which application is hereby incorporated by reference in its entirety.

BACKGROUND

Technical Field

The present disclosure generally relates to field effect transistor (FET) structures with wrap-around gates and, in particular, to a high performance multi-channel gate-all-around FET.

Description of the Related Art

Conventional integrated circuits incorporate 2-D planar field effect transistors (FETs) in which current flows through a semiconducting channel between a source and a drain, in response to a voltage applied to a control gate. To provide better control of the current flow, 3D transistors have also been developed. A 3D transistor structure is shown and described below in comparison with a traditional 2-D planar transistor. A 3D transistor is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. The improved control achieved with a 3D design results in faster switching performance and reduced current leakage, which allows 3D transistors to consume less power so that they can operate at a lower supply voltage. Intel described this type of transistor in an announcement on May 4, 2011, calling it by various names including a 3D transistor, a 3-D Tri-Gate transistor, or a FinFET. (See, for example, the article titled "How Intel's 3D tech redefines the transistor" located on the Internet at http://news.cnet.com/8301-13924_3-20059431-64.html; see also U.S. Patent Application Publication No. 2009/0090976 to Kavalieros et al., published on Apr. 9, 2009; U.S. Pat. No. 8,120,073 to Rakshit et al.; U.S. Pat. No. 7,973,389 to Rios et al.; U.S. Pat. No. 7,456,476 to Hareland et al.; and U.S. Pat. No. 7,427,794 to Chau et al.) FinFET transistors are now well known in the art and are used throughout the semiconductor industry to provide high speed and high reliability transistor performance for devices having gate dimensions smaller than about 25 nm.

More recently, another type of 3D transistor has been developed for technology nodes below 10 nm, referred to as a gate-all-around (GAA) FET, in which the gate surrounds all four sides of the current channel so as to influence the current flow from every direction, and reduce short channel effects (SCE). Instead of providing a fin, in a GAA FET the current channel takes the form of one or more silicon nanowires coupling the source and drain regions.

BRIEF SUMMARY

A high performance gate-all-around (GAA) FET is described in which vertically stacked silicon nanowires carry substantially the same drive current as the fin in a conventional FinFET device, but at a lower operating voltage, and with greater reliability. One problem that occurs in existing nanowire GAA FETs is that, when a conductive material is used to form the wrap-around gate, a short circuit can develop between the source and drain regions and the conductive gate portion that underlies the channel. The vertically stacked nanowire device described herein avoids such short circuits by forming insulating barriers in contact with the source and drain regions, with a temporary gate structure in place. An array of silicon nanowires is formed from a tall multi-layer fin by removing material between the silicon layers. Finally, a permanent replacement metal gate stack is wrapped around the silicon nanowires. Through the use of sacrificial films, the fabrication process is self-aligned, such that only one lithography mask layer is needed, which significantly reduces manufacturing costs.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIGS. 5A-5D illustrate formation of a patterned hard mask and a sacrificial gate structure, according to one embodiment.

FIG. 5A is a longitudinal cross-sectional view along a line cut through the center of the gate region of a partially formed GAA FET.

FIG. 5B is a transverse cross-sectional view along a line cut across and through the partially formed GAA FET.

FIG. 5C is a longitudinal cross-sectional view along a line cut through the sidewall spacer of the partially formed GAA FET.

FIG. 5D is a horizontal cross-sectional view along a line cut through the gate region of the partially formed GAA FET.

FIGS. 6A-10C show views corresponding to those of FIGS. 5A-5C, at various times during formation of the GAA FET, according to one embodiment.

DETAILED DESCRIPTION

Figure 1A:
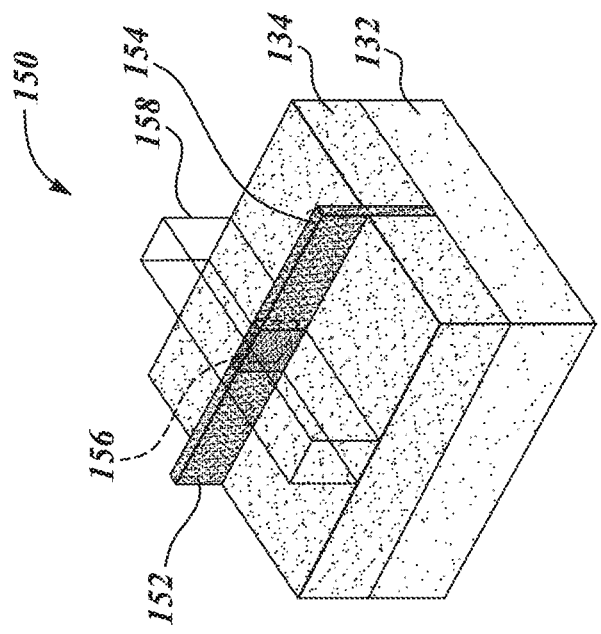
FIG. 1A is a pictorial perspective view of a conventional planar FET according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases in "one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to nanowire GAA FETs that have been developed and/or produced; however, the present disclosure and the reference to certain materials, dimensions, and the details and ordering of processing steps are exemplary and should not be limited to those shown.

Figure 1B:
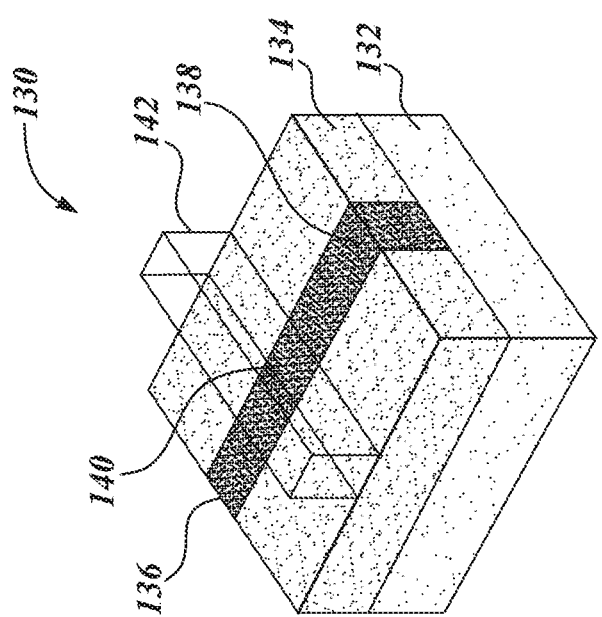
FIG. 1B is a pictorial perspective view of a prior art FinFET.

FIGS. 1A and 1B provide general information about FinFETs, familiar to those skilled in the art of transistor design. FIG. 1A shows a conventional planar transistor 130 built on a silicon substrate 132. FIG. 1A, a non-FinFET device, is included herein for comparison with the FinFET shown in FIG. 1B. Parts of the conventional planar transistor include an active region 134, a source 136, a drain 138, a planar conducting channel 140, and a gate 142. A gate dielectric, not shown, electrically isolates the channel from the gate, as is well known in the art. The active region 134 occupies a top layer of the substrate that may be doped with impurities to create a well having a net negative or net positive charge. When the conventional planar transistor 130 is on, current flows from the source 136 to the drain 138, through the planar conducting channel 140. Current flow in the planar conducting channel is controlled by the gate 142 by application of a gate voltage. An electric field associated with the gate voltage has the effect of turning on the conventional planar transistor 130 if the gate voltage exceeds a certain threshold. If the applied gate voltage drops below the threshold voltage, the conventional planar transistor 130 shuts off and current ceases to flow from the source 136 to the drain 138. Because the gate 142 can only influence the planar conducting channel 140 from one side (i.e., from the top of the planar conducting channel 140), charge leakage into the silicon substrate 132 tends to occur at the channel/substrate junction.

FIG. 1B shows a conventional FinFET device 150 built on the silicon substrate 132. Analogous to the device shown in FIG. 1A, parts of the conventional FinFET device 150 include an active region 134, a source 152, a drain 154, a conducting fin channel 156, and a wrap-around gate 158. The active region 134 of the conventional FinFET device 150 may be doped with impurities to create a well having a net negative or net positive charge. When the conventional FinFET device 150 is on, current flows from the source 152 to the drain 154, through the tall, conducting fin channel 156, under control of the wrap-around gate 158. Application of a voltage having a value that exceeds a certain threshold voltage value turns the conventional FinFET device 150 on. If the applied voltage drops below the threshold voltage value, the conventional FinFET device 150 shuts off and current ceases to flow from the source 152 to the drain 154. Because the wrap-around gate 158 influences the conducting fin channel 156 from three sides, improved control of the conduction properties of the conducting fin channel 156 is achieved. Such improved control causes leakage of charge from the conducting fin channel 156 to the silicon substrate 132 to be reduced, although not eliminated. Because the current-carrying capacity of a 30-40 nm tall fin channel 156 is about 60% greater than that of the planar conducting channel 140, the switching characteristics, and therefore the overall speed, of the conventional FinFET device 150 is also improved over those of the conventional planar transistor 130.

Figure 2:
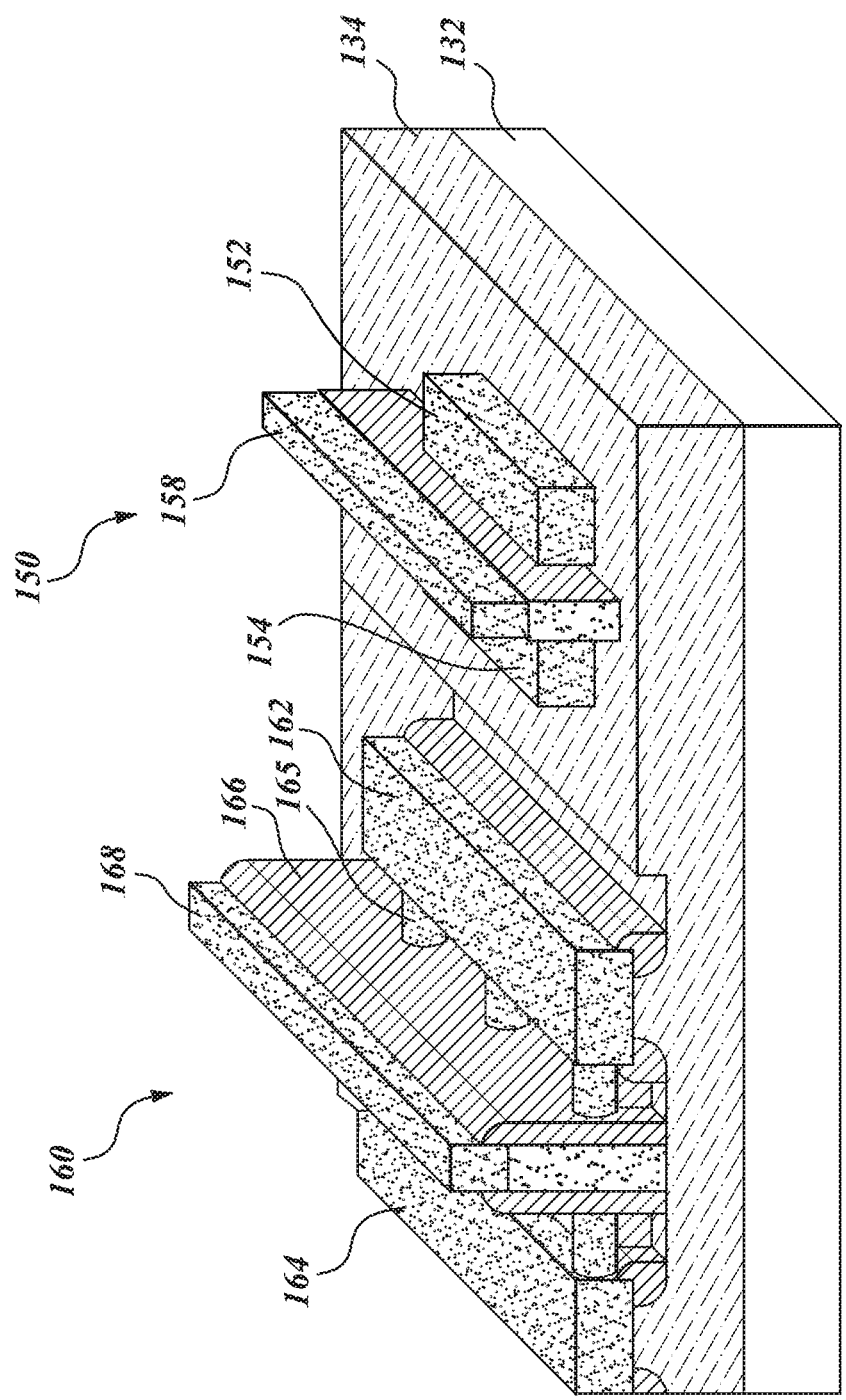
FIG. 2 is a pictorial perspective view of a gate-all-around (GAA) FET (left), compared with that of a FinFET (right), according to the prior art.

FIG. 2 shows an example of an existing nanowire gate-all-around (GAA) FET 160, as described in U.S. Patent Application Publication No. 2013/0341596 to Chang et al., of IBM. The GAA FET 160 is shown next to a slightly different perspective view of the conventional FinFET device 150 for direct comparison. The GAA FET 160 includes a source region 162, a drain region 164, sidewall spacers 166, and a wrap-around gate 168. Instead of fins, the GAA FET 160 includes nanowires 165. It is noted that portions of the nanowires 165 are fully surrounded by the sidewall spacers 166, and by the wrap-around gate 168. The central portions of the nanowires 165 that are surrounded by, and therefore controlled by, the wrap-around gate 168 are silicon nanowire channels, analogous to the conducting fin channels 156. The conducting fin channels 156, however, provide about twice as much drive current as a silicon nanowire channel. Thus, one row of nanowires 165 as shown in FIG. 2 is limited to low power applications.

Figure 3:
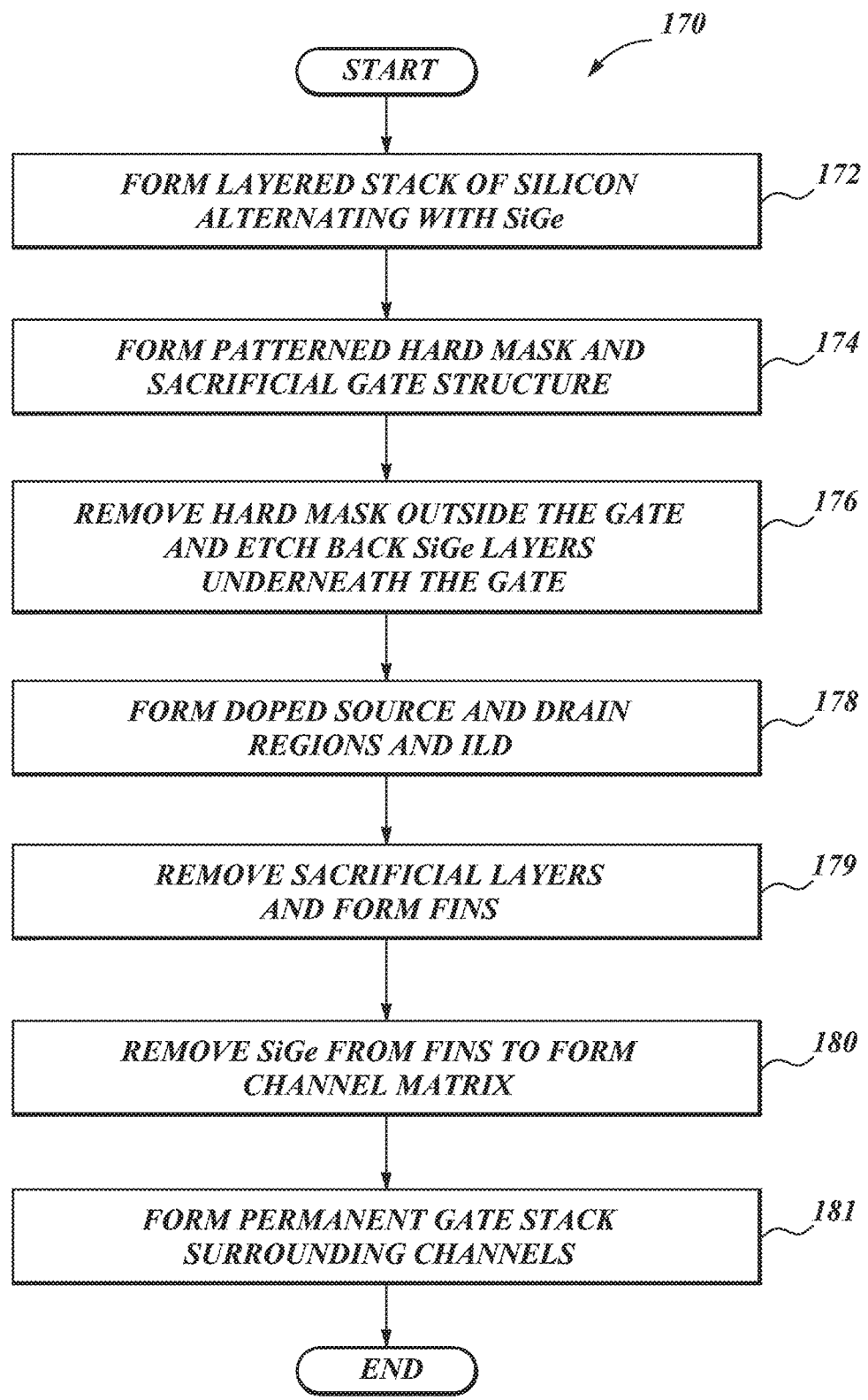
FIG. 3 is a high-level flow diagram summarizing a processing sequence for fabricating a multi-channel GAA FET according to one exemplary embodiment described herein.

FIG. 3 shows a high-level sequence of actions in an inventive method 170 of fabricating a multi-channel gate-all-around FET, according to one embodiment. Using the fabrication method 170, a multi-channel GAA FinFET device that includes a 3D matrix of nanowires can be built on a silicon-on-insulator type (SOI) wafer for use in high performance, high power applications.

The method 170 begins with an SOI wafer that includes a layer of buried oxide (BOX) within a silicon substrate. As is well known in the art, a typical BOX layer of an SOI wafer has a thickness within the range of about 5-100 nm. The region of silicon located above the BOX layer is an electrically active region where GAA FETs will be formed. The thickness of the active region is within the range of about 5-35 nm. SOI wafers are generally much more expensive than bulk silicon wafers. As an alternative to purchasing SOI wafers as a start material, SOI wafers can be fabricated from bulk silicon wafers.

At 172, a layered stack of silicon alternating with SiGe films is formed.

At 174, a patterned hard mask is formed on top of the layered stack and a sacrificial gate structure is formed, including sacrificial sidewall spacers adjacent to a silicon gate.

At 176, the hard mask outside the gate region is removed and SiGe layers underneath the gate are recessed.

At 178, doped source and drain regions are formed adjacent to the layered stack underneath the gate. An interlayer dielectric (ILD) is then formed on top of the doped source and drain regions.

At 179, the sacrificial spacers are removed, and the layered stack outside the gate region is etched to form semiconducting fins.

At 180, SiGe is removed from the fins to form a matrix of silicon channels, or nanowires.

At 181, the silicon channels are surrounded by a permanent gate structure.

Figure 4:
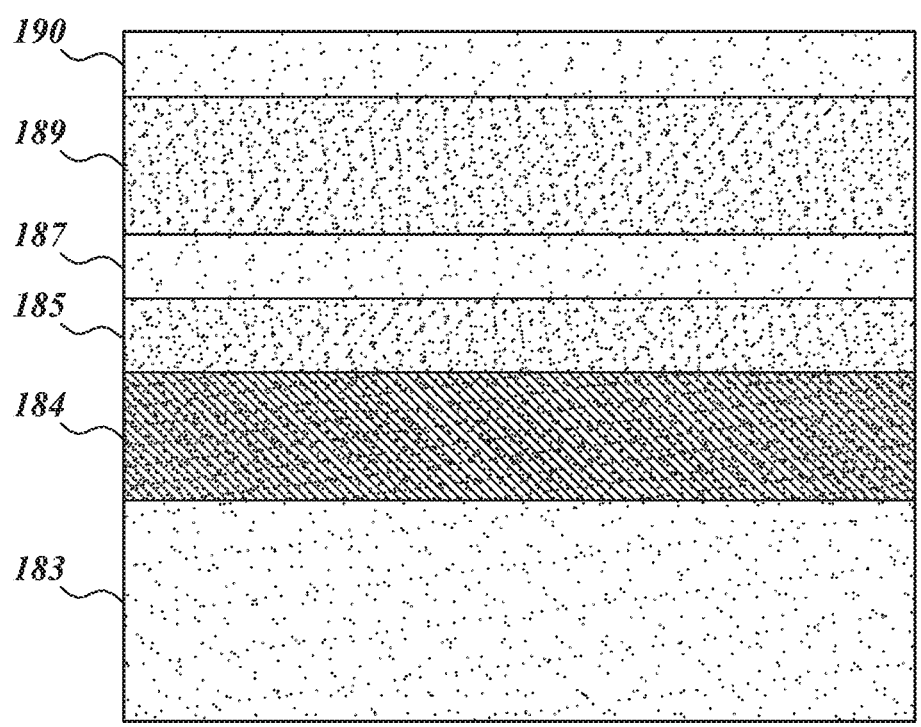
FIG. 4 is a cross-sectional view of a layered stack of alternating silicon and silicon germanium (SiGe) films.

FIG. 4 illustrates the initial process step 172 in which a layered stack of Si and SiGe are formed on a silicon substrate according to one embodiment. First, an SOI wafer is obtained that includes a silicon substrate 183, a BOX layer 184 in the substrate 183, and an active layer 187 of silicon, in which GAA devices will be formed. A first layer of silicon germanium (SiGe) 185 is initially formed on top of the active layer 187, for example, by epitaxial growth or by another method of deposition known in the art. The first layer of SiGe 185 is then oxidized so as to drive the SiGe downward through the active layer 187, thus diffusing the SiGe atoms through the silicon lattice. Diffusion stops on the BOX layer, 184, however, so that the first layer of SiGe 185 resides below the active layer 187 but above the BOX layer 184. A second layer of SiGe 189 is formed on top of the active layer 187, followed by a top layer of silicon 190. Alternatively, a layered stack of SiGe layers alternating with silicon layers can be formed on a silicon substrate instead of on an SOI substrate.

FIGS. 5A-10C illustrate further steps in the method 170. In each set of Figures for the subsets of A-C, A is a cross-sectional schematic view along a cut line through the gate region of the GAA FinFET device; B is a cross-sectional view through the source, drain, and gate along a cut line aligned with one of the silicon nanowire channels; C is a cross-sectional view along a cut line through a source/drain region of the GAA FinFET device; and D is a horizontal cross-sectional view along a cut line through the gate stack. In accordance with convention, arrows on each cut line represent the direction of an observer's eye looking at the corresponding cut plane.

FIGS. 5A-5D illustrate the process step 174 in which sacrificial structures are formed according to one embodiment. First, a thin oxide is deposited or grown on the top layer of silicon 190. Then a hard mask 191 is deposited and patterned. The hard mask 191 can be made of, for example, an oxide such as alumina ($Al_2O_3$) having a thickness in the range of about 20-40 nm. The hard mask 191 will be used at a later time when etching the layered Si/SiGe stack to form elongated fins. Next, a sacrificial gate stack is deposited. The sacrificial gate stack includes a sacrificial gate 193 made of a 50-150 nm thick layer of amorphous silicon, followed by a 3-10 nm layer of a sacrificial high-k gate dielectric 195 such as, for example, hafnium oxide ($HfO_2$) as shown in FIG. 5A. The sacrificial gate stack is then patterned using a hard mask (not shown), for example, a layer of SiN having a thickness within the range of about 20-50 nm. Etching the sacrificial gate stack to form the structure shown in FIG. 5B is straightforward, because the aspect ratio, or height-to-width ratio, of the gate is fairly small. For example, the aspect ratio shown in FIG. 5B is approximately 2. After etching the gate stack, the SiN hard mask is removed. Next, a sacrificial spacer layer 197 made of SiN is blanket deposited over the patterned gate stack to form a substantially planar SiN surface. The thickness of the sacrificial spacer layer 197 over the sacrificial gate stack as shown in FIG. 5A is in the range of about 20-50 nm, whereas the thickness of the sacrificial spacer layer 197 as shown in FIG. 5C is in the range of about 70-200 nm. The sacrificial spacer layer 197 is then patterned to form sidewalls on the sacrificial gate structure, as shown in FIG. 5B. Whereas the spacer layer is typically removed from the top of the gate, in the present process, the spacer remains in place covering the sacrificial gate.

FIGS. 6A-6C illustrate the process step 176 in which the layered stack of SiGe and silicon is patterned outside the sacrificial gate, according to one embodiment. First, the sacrificial spacer layer 197 is used as a mask for etching through the hard mask 191 as shown in FIG. 6B. Next, the sacrificial spacer layer 197 again is used as a mask for etching through the layered stack of SiGe and silicon, down to the substrate 183, in the source and drain regions. In one embodiment, the etching chemistry used to remove the layered stack is hydrogen bromide (HBr), and the BOX layer 184 is etched using a fluorocarbon chemistry such as $CF_4$. A lateral etch is then performed that preferentially attacks the SiGe layers 185 and 189 in the regions beneath the sacrificial spacer layer 197, using an etch chemistry that has high selectivity to silicon, silicon, $SiO_2$, and SiN. Such a process can entail exposure of the SiGe to a dry, gas phase hydrochloric acid (HCL), or a wet SC1 clean, wherein SC1 is a mixture that includes ammonium hydroxide ($NH_3OH$), HCL, and hydrogen peroxide ($H_2O_2$), as is known to those skilled in the art. In one embodiment, the lateral etch is timed to consume all of the SiGe outside the spacer, and to stop after about 6-15 nm of the SiGe underneath the spacer has been consumed. The resulting lateral undercut depth approximately matches the spacer sidewall thickness 199.

FIGS. 7A-7C illustrate the process step 178 in which source and drain regions of the GAA transistor are formed, according to one embodiment. First, the areas where the SiGe was removed underneath the spacers are filled with SiN, HfO$_2$, or another suitable dielectric fill material 211. In one embodiment, the fill operation includes a conformal deposition up to the level of the top layer of silicon 190, followed by a highly anisotropic etch back step in which the dielectric fill material 211 outside the spacers is removed in the vertical direction, down to the level of the substrate 183, without any significant lateral erosion. A source region 213*a* and a drain region 213*b* are then formed on either side of the gate stack. In one embodiment, the source and drain formation includes epitaxial growth of a semiconductor film during which dopants are introduced and incorporated into the film while it is being deposited. For a P-type FET (PFET), the in-situ doped film can be, for example, boron-doped SiGe. For an N-type FET (NFET), the in-situ doped film can be, for example, arsenic- or phosphorous-doped silicon or silicon carbide (SiC). Next, an inter-layer dielectric (ILD) 215 such as SiO$_2$ is deposited on top of each of the source and drain regions 213*a* and 213*b*, respectively. Alternatively, the ILD 215 can be a ULK dielectric having a dielectric constant less than about 4.0. The ILD is then planarized using a chemical-mechanical planarization (CMP) process, as is well known in the art. The CMP process removes the ILD 215 down to the surface of the sacrificial spacer layer 197.

FIGS. 8A-8C illustrate the process step 179 in which the sacrificial spacer layer is replaced and fins are formed, according to one embodiment. First, the entire sacrificial spacer layer 197 is removed from either side of the gate stack, as shown in FIGS. 8B and 8C. In one embodiment, the spacer removal process entails a combination dry and wet etch step followed by a wet cleaning step, wherein the etch chemistries used are selective to the underlying hard mask 191. Following spacer removal, fins 221 are formed by etching the layered stack of silicon and SiN, as shown in FIG. 8C, using the hard mask 191. The fins 221 include the active layer 187 and the top layer of silicon 190, separated by layers of the dielectric fill material 211. During formation of the fins 221, the sacrificial gate dielectric 195 acts as a mask to protect the sacrificial gate 193. The sacrificial gate dielectric 195 is then removed using, for example, a high temperature, isotropic chlorine-based reactive ion etch (RIE) process. Such a chemistry will selectively consume HfO$_2$ without eroding the amorphous silicon sacrificial gate 193. Furthermore, such an isotropic, chemically-dominated etch process will selectively remove the thin layer of HfO$_2$ without incurring lateral erosion of the ILD 215. Next, a permanent low-k spacer 223 replaces the sacrificial spacer layer 197. The permanent low-k spacer 223 can be made of a type of doped SiN such as, for example, a SiN that contains boron and carbon, e.g., SiBCN, or a SiN that contains oxygen and carbon, e.g., SiOCN. Following spacer deposition, the permanent low-k spacer 223 is etched back to the surface of the sacrificial gate 193, which is below the height of the ILD 215, as shown in FIG. 8B. This can be done by an RIE process or the like.

FIGS. 9A-9C illustrate the process step 180 in which a matrix of silicon channels is formed according to one embodiment. The channels can be referred to as silicon nanowires. First, the ILD 215 is etched back to the height of the permanent low-k spacer 223 using a standard CMP process. Prior to forming the channel matrix, the sacrificial gate 193 is selectively removed. The sacrificial gate 193 can be etched in a process that selectively attacks silicon while preserving the permanent low-k spacer 223 and the remaining hard mask 191, which is to remain present in the final GAA device. Such a process can employ, for example, a Cl$_2$— and/or HBr-based chemistry.

Next, fins are formed inside the gate region by etching the layered stack of silicon and SiGe, as shown in FIG. 9B, using the hard mask 191. The fins are an intermediate structure formed prior to forming an array of channels. The fins are not shown in FIG. 9A, 9B, or 9C. During formation of the fins inside the gate region, the gate dielectric 195 acts as a mask to protect the sacrificial gate 193. The SiGe layers 185 and 189 are then removed from the gate region as shown in FIGS. 9A and 9B, thus forming the channel matrix shown in FIGS. 9A, 9B, and 9C. The channel matrix includes an upper array of conducting channels 235 and a lower array of conducting channels 237 that couple the charge reservoirs that make up the source region 213*a* and the drain region 213*b*. In the end view shown in FIG. 9B, the channels appear to be suspended, however, it is noted that the ends of the channels shown in FIG. 9C are well-supported by the source and drain regions and by the fins 221 outside the gate region. The channel length between the source and the drain regions is less than about 20 nm. Removal of the SiGe layers 185 and 189 employs an isotropic etch that attacks silicon selectively, while leaving behind SiN and SiO$_2$, as described above in steps 234 and 204. During the SiGe removal step, the dielectric fill material 211 in the gate area protects the source and drain regions 213*a* and 213*b*, respectively, from being eroded. The silicon nanowires thus formed are designed to carry a drive current consistent with a linear current density in the range of about 0.5-3.0 mA/μm. The linear current density is normalized to be the current per effective channel width.

FIGS. 10A-10C illustrate the process step 181 in which fabrication of the GAA FET is completed by forming a permanent gate stack according to one embodiment. First, an optional hydrogen bake can be performed in which exposed portions of the silicon channels within the gate region, shown in FIG. 9A as having a square cross section, are rounded. It may be advantageous for the silicon channel, or nanowire, to have a circular-cylindrical shape to prevent charging that would otherwise occur if the shape of the cross-section had corners or points, such as a rectangular cylinder. Corner rounding by use of a hydrogen bake is known in the art. Next, a permanent gate stack is formed as the last step in the process. Whereas it is typical to form the gate first, the current process forms barriers between the gate and the source/drain regions first, i.e., the hard mask 191 and the fill dielectric material 211, and a replacement metal gate is formed last. First, exposed portions of the silicon channels within the gate region are oxidized to form a replacement gate oxide 239. The replacement gate oxide 239 desirably has a high dielectric constant such as that of HfO$_2$, for example. Then, a replacement gate 241 is deposited and planarized to the same height as the permanent low-k spacers 223 and the ILD 215, in the usual way. The replacement gate thus fully surrounds each one of the silicon nanowires within the arrays of conducting channels 235 and 237. The replacement gate is desirably made of a conductive gate material e.g., a metal. Alternatively, the replacement gate 241 can be made of a semiconducting material such as, for example, polysilicon.

It is noted that remaining portions of the hard mask 191 are still present in the completed GAA FET, as shown in FIGS. 10A, 10B, and 10C. The hard mask 191 thus provides additional electrical insulation between the replacement gate 241 and the array of conducting channels 235 at the corners of the replacement gate 241 where the electric field tends to be strong because of the concentration of charge present at points and corner features. It is this additional barrier, as well as the dielectric fill material 211, that prevents short circuits that otherwise would cause current leakage between the replacement gate 241 and the source and drain regions 213a and 213b.

It is further noted that the process described herein includes only one photolithography mask layer, at the beginning of the process, to pattern the hard mask 191. All other patterning in the process described herein is accomplished through the use of self-aligned structures that act as masks for adjacent materials. Some of the self-aligned structures are temporary structures that are removed and replaced by other materials in the final device configuration. By avoiding the use of lithography wherever possible, many conventional processing steps can be skipped. For example, none of the usual steps involving coating the wafer surface with a photoresist mask, developing the photoresist, or cleaning off the photoresist are needed. Consequently, many of the usual sources of particles and contamination are also eliminated. Such a self-aligned process operates more smoothly because manufacturing operations do not rely on availability of optical lithography equipment which is generally more costly and more vulnerable to down-time events than deposition and etch equipment. Finally, the need for alignment and registration of patterns at different layers is not necessary because use of one layer to pattern the next ensures that the proper alignment is achieved automatically.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming, on top of a substrate, a layered stack of SiGe layers alternating with silicon layers;
   forming a temporary gate structure over the layered stack;
   forming first and second insulating spacers that coat respective side walls of the temporary gate structure;
   forming a source region below the temporary gate structure and adjacent to the first insulating spacer;
   forming a drain region below the temporary gate structure and adjacent to the second insulating spacer;
   forming from the layered stack an array of vertically stacked silicon nanowires, each nanowire having end portions and a central portion; and
   replacing the temporary gate structure with a metal gate structure that fully surrounds the central portions of the nanowires to fill a volume of space between the nanowires, wherein forming the temporary gate structure includes:
   forming a hard mask on top of the layered stack;
   patterning the hard mask; and
   removing the patterned hard mask adjacent to the insulating spacers, while retaining the patterned hard mask underneath the insulating spacers.

2. The method of claim 1, further comprising forming an inter-layer dielectric (ILD) on top of the source and drain regions.

3. The method of claim 1 wherein forming the layered stack includes inserting SiGe into a silicon-on-insulator (SOI) substrate that includes a silicon layer on top of an insulating layer.

4. The method of claim 3 wherein inserting SiGe into a SOI substrate includes:
   depositing SiGe on top of the silicon layer of the SOI substrate; and
   forming a first SiGe layer between the silicon layer and the insulating layer by diffusing the SiGe through the silicon layer.

5. The method of claim 1, wherein forming the array of vertically stacked silicon nanowires further comprises:
   forming fins from the layered stack; and
   removing lateral portions of at least two SiGe layers from the fins.

6. The method of claim 1, further comprising rounding the silicon nanowires using a high-temperature $H_2$ silicon reflow process to form circular cylinders.

7. The method of claim 1, further comprising forming a high-k gate oxide in contact with the silicon nanowires prior to replacing the temporary gate structure with the metal gate structure.

8. The method of claim 1, further comprising:
   first and second undercut regions by etching lateral portions of the SiGe layer, the first and second undercut regions being at the first and second sides of the etched stack, respectively, the method further comprising:
   forming third and fourth insulating spacers in the first and second undercut regions, respectively, the third and fourth insulating spacers insulating the metal gate electrode from the source and drain regions.

9. A method, comprising:
   forming a layered stack of alternating silicon and SiGe films;
   forming a temporary gate structure including sidewall spacers and a temporary gate electrode;
   forming a fin from the layered stack using the temporary gate structure as a mask;
   forming undercut regions in the fin by etching the SiGe films laterally under the temporary gate structure;
   filling the undercut regions with an insulating material;
   removing the temporary gate electrode;
   removing the SiGe films; and
   replacing the temporary gate electrode and the SiGe films with a metal gate electrode, wherein forming the temporary gate structure includes:
   forming a hard mask on top of the layered stack;
   patterning the hard mask; and
   removing the patterned hard mask adjacent to the sidewall spacers, while retaining the patterned hard mask underneath the sidewall spacers.

10. The method of claim 9 wherein the sidewall spacers have a spacer width, the undercut regions have an undercut depth, and the undercut depth approximately matches the spacer width.

11. The method of claim 9 further comprising forming a source region and a drain region that are spaced apart from the metal gate electrode by the insulating material.

12. The method of claim 9, wherein replacing the temporary gate electrode and the SiGe film layers with a metal gate electrode includes:
   removing a central portion of the hard mask using the sidewall spacers as a mask, while retaining portions of the hard mask underneath the sidewall spacers; and
   depositing the metal gate electrode in an opening between the sidewall spacers and between the portions of the hard mask underneath the sidewall spacers.

13. The method of claim 9, wherein forming the layered stack includes inserting SiGe into a silicon-on-insulator (SOI) substrate that includes a silicon layer on top of an insulating layer, wherein inserting SiGe into a SOI substrate includes:
   depositing SiGe on top of the silicon layer of the SOI substrate; and
   forming a first SiGe layer between the silicon layer and the insulating layer by diffusing the SiGe through the silicon layer.

14. A method, comprising:
   forming, on top of a substrate, a layered stack of SiGe layers alternating with silicon layers;
   forming a hard mask on top of the layered stack, the hard mask including a plurality of elongated strips;
   forming a temporary gate structure over the hard mask and the layered stack;
   forming a spacer layer on top and lateral sides of the temporary gate structure and on the hard mask;
   etching the hard mask while using the spacer layer as a mask to form etched strips of the hard mask;
   etching through the layered stack using the etched strips of the hard mask and the spacer layer as a mask to form an etched stack of the SiGe layers alternating with silicon layers;
   forming a source region at a first side of the etched stack;
   forming a drain region at a second side of the etched stack;
   forming from the etched stack an array of vertically stacked silicon nanowires by etching through the etched stack using the etched strips of the hard mask as a mask, each nanowire having end portions and a central portion; and
   replacing the temporary gate structure with a metal gate structure that fully surrounds the central portions of the nanowires to fill a volume of space between the nanowires.

15. The method of claim 14, wherein:
   etching through the layered stack to form the etched stack includes forming undercut regions in the etched stack by etching the SiGe films laterally and under the temporary gate structure; and
   the sidewall spacers have a spacer width, the undercut regions have an undercut depth, and the undercut depth approximately matches the spacer width.

16. The method of claim 14, wherein etching through the layered stack to form the etched stack includes forming first and second undercut regions in the etched stack by laterally etching the SiGe films, the first and second undercut regions being at the first and second sides of the etched stack, respectively, the method further comprising:
   forming first and second insulating spacers in the first and second undercut regions, respectively, the first and second insulating spacers insulating the metal gate electrode from the source and drain regions.

17. The method of claim 14, further comprising:
   removing a portion of the spacer layer from the top side of the temporary gate structure, thereby leave side portions of the spacer layer as insulating spacers; and
   removing a central portion of the hard mask using the insulating spacers as a mask, while retaining portions of the hard mask underneath the insulating spacers.

18. The method of claim 17, further comprising forming an inter-layer dielectric on top of the source and drain regions and in contact with the insulating spacers.

19. The method of claim 14, wherein forming the layered stack includes inserting SiGe into a silicon-on-insulator (SOI) substrate that includes a silicon layer on top of an insulating layer.

20. The method of claim 19, wherein inserting SiGe into a SOI substrate includes:
   depositing SiGe on top of the silicon layer of the SOI substrate; and
   forming a first SiGe layer between the silicon layer and the insulating layer by diffusing the SiGe through the silicon layer.

* * * * *